United States Patent [19]
Baudet

[11] Patent Number: 5,844,321
[45] Date of Patent: Dec. 1, 1998

[54] SEMICONDUCTOR DEVICE COMPRISING A CHIP WHICH IS PROVIDED WITH A VIA OPENING AND IS SOLDERED ON A SUPPORT, AND METHOD OF REALIZING THIS DEVICE

[75] Inventor: Pierre Baudet, Yerres, France

[73] Assignee: U.S. Philips Corporation, New York, N.Y.

[21] Appl. No.: 808,591

[22] Filed: Feb. 28, 1997

[30] Foreign Application Priority Data

Feb. 28, 1996 [FR] France .................................. 96 02492

[51] Int. Cl.$^6$ ........................ H01L 23/48; H01L 23/52; H01L 29/40
[52] U.S. Cl. ........................ 257/779; 257/774; 257/728; 333/246; 333/247
[58] Field of Search ................................. 257/774, 779, 257/728; 333/246, 247

[56] References Cited

FOREIGN PATENT DOCUMENTS

| 436912A1 | 7/1991 | European Pat. Off. ........ H01L 23/48 |
| 631313A1 | 12/1994 | European Pat. Off. ........ H01L 23/48 |

Primary Examiner—Mahshid D. Saadat
Assistant Examiner—Jhihan B. Clark
Attorney, Agent, or Firm—Norman N. Spain

[57] ABSTRACT

A semiconductor device comprises a chip soldered to a support. The chip comprises a semiconductor substrate, a via a ground plane on a rear surface, and an anti-adhesion layer deposited continuously inside the via. A solder layer which does not wet the anti-adhesion layer but which does wet the ground plane has a globular shape in the via opening and makes no mechanical contact with the walls of the via. The manufacturing process comprises the sandwiching of a soldering preform between the support and the rear surface provided with the ground plane and said anti-adhesion layer, and melting of the preform under pressure so that the solder rises in globular shape inside the via. The anti-adhesion layer is realized without mask.

9 Claims, 9 Drawing Sheets

FIG._2E

SEMICONDUCTOR DEVICE COMPRISING A CHIP WHICH IS PROVIDED WITH A VIA OPENING AND IS SOLDERED ON A SUPPORT, AND METHOD OF REALIZING THIS DEVICE

BACKGROUND OF THE INVENTION

Semiconductor device comprising a chip which is provided with a via opening and is soldered on a support, and method of realizing this device.

DESCRIPTION

The invention relates to a semiconductor device comprising a chip with a semiconductor substrate having a front surface and a rear surface, a conductor element of a circuit on said front surface, a via opening extending through the substrate and having lateral walls and a bottom which coincides with the conductor element, a conductive layer or ground plane covering said rear surface and the lateral walls and the bottom of the via opening and forming a connection to the conductor element, and a support with a receiving surface on which the chip is soldered with its rear surface.

The invention also relates to a method of realizing this device.

The invention finds its application in the manufacture of integrated circuits, and more particularly microwave frequency circuits which are monolithically integrated on a gallium arsenide substrate (MMICs).

Such a device and a method of realizing it are known from European Patent Application EP 631 313 from MITSUBISHI DENKI KABUSHIKI KAISHA (reference KOSAKI). The known device comprises in addition to the element described above a layer of a material suitable for preventing the adhesion of the soldering material which is used for fixing the rear surface of the chip on the support.

According to the cited document, said layer of material preventing adhesion is deposited on the rear surface of the substrate on the ground plane such that it only covers the bottom of the metallized via. This anti-adhesion layer is made to terminate at a distance d from the bottom of the via, which distance is calculated as a function of the breakdown resistance of the substrate material, which is 73.7 $\mu$m for a gallium arsenide substrate having a thickness of 150 $\mu$m. When the rear surface is soldered to a support, the Au-Sn soldering material will rise inside the via along the via walls not provided with said anti-adhesion layer and will stop exactly at the level of the anti-adhesion layer.

Thus a free space without soldering material is formed over a height d=73.7 $\mu$m measured from the bottom of the via and calculated as a function of the thickness of the substrate which is equal to 150 $\mu$m.

It should be noted that the upper surface of the soldering material Au-Sn inside the via is plane and parallel to the front and rear surfaces of the device, or alternatively exhibits a concavity, i.e. hollowed out towards the bottom of the via.

It should also be noted that the soldering material Au-Sn adheres strongly to the lower portion of the via walls over approximately half the height of the via, where these walls have no anti-adhesion layer. The adhesion height is in effect equal to the height of the via, which is 150 $\mu$m minus the height of the free space, which is d=73.7 $\mu$m.

It should further be noted that the formation of the anti-adhesion layer with a height d requires the use of a special masking step in the manufacturing process.

The KOSAKI reference claims to solve two technical problems as described which arise in the manufacture of chips provided with vias and soldered on a support.

A first technical problem arises when the rear surface of the device and the interior of the via are simply provided with a ground plane formed by a gold layer, which favors the adhesion of the Au-Sn soldering material. During the operation of soldering on the support by means of the Au-Sn material, this soldering material will spontaneously rise in the via by wetting the gold and will completely fill the via, and subsequently it will produce cracks in the substrate owing to contraction during cooling-down, as is shown in FIGS. 20a and 20b of the cited document.

A second technical problem arises when the walls of the via are totally provided with a layer which prevents wetting, while other portions of the ground plane at the rear surface of the chip are not provided therewith. During the soldering operation on a support, said Au-Sn soldering material will not rise in the via at all, as is shown in FIG. 21 of the cited document. In that case the soldered chip will give problems in heat dissipation.

Further technical problems have become apparent in the investigations which have led to the present invention.

First of all, relating to the first technical problem described above with reference to said FIGS. 20a and 20b, not only do cracks appear in the substrate around the via, but the gold layer which serves simultaneously as a ground plane and as a wetting layer also has a tendency to detach itself at the bottom of the via. In addition, the soldering process tends to create rifts also in the upper circuit element. This accordingly results in a detrimental effect which is not reported, i.e. the possible rupturing of the ground plane.

Furthermore, relating to the second cited problem illustrated in said FIG. 21, experience has shown that it is not strictly true that the soldering material does not rise at all inside the vias in the case of a device having a plurality of vias with internal anti-wetting layers. In general, the soldering material rises in each via with a certain random quantity, which may again lead to soldering imperfections or blisters on the plane portions of the rear surface between the vias. This leads to a detrimental effect in that the device is very badly soldered. On the other hand, since the semiconductor substrate is very thin and very fragile, another adverse consequence is that the substrate may fracture at the regions of the blisters. In addition, the vias are generally not realized in locations of the circuit which are most strongly heated; these are present below the gates of, for example, field effect transistors. The blisters arising between the vias are accordingly present exactly in those portions which require the greatest heat dissipation, which is a major disadvantage.

In addition, the height of the via walls over which adhesion is permitted is great compared with the total height of the vias in the solution presented by the cited document and illustrated, for example, in FIG. 1b. Experience has shown that cracks still arise at the level of this adhesion region into the body of the substrate. These cracks are substantially vertical, are arranged around the vias, and generally do not issue into the front surface of the device, being invisible when this front surface is viewed. These deep cracks have a detrimental consequence which is that they render possible the diffusion of solder into the material which forms the substrate, indeed towards the active regions of the substrate, which results in random variations in transistor performance, which is a major disadvantage.

SUMMARY OF THE INVENTION

The present invention has for its object to provide a device in which these technical problems are no longer present. The invention in addition has for its object to provide a method of manufacturing this device which is particularly simple because it does not comprise a masking step.

SUMMARY OF THE INVENTION

According to the invention, these problems are resolved by means of a semiconductor device as described above, wherein:

said chip in addition comprises a layer called anti-adhesion layer which is deposited on said ground plane exclusively inside the via opening, provided continuously over the bottom and the lateral walls up to a stopping level which lies close to the rear surface of the substrate, and said chip is fixed to said support by means of a layer of a soldering material of a type which adheres to the ground plane material and does not wet the anti-adhesion layer, such that:

said layer of soldering material has a planar portion between the receiving surface of the support and the rear surface of the substrate, and has a globular portion present inside the via opening, and a free space is maintained continuously all around said globular portion between the soldering material and the anti-adhesion layer from the bottom of the via opening up to said stopping level of the anti-adhesion layer.

The advantages are the following:

the globular solder portion can rise far into the via opening and thus ensure a better heat dissipation;

the globular solder portion rises inside the via without any mechanical contact with the walls or the bottom of the via and accordingly cannot generate cracks in the substrate;

and, since the substrate comprises several vias, the distribution of the solder forming the globular portions inside the vias is very uniform, and no blisters will be formed in the planar region between the substrate and the support.

The solder between the substrate and the support will thus be of very good quality mechanically, and the ground plane has a very good electrical performance in the microwave frequencies.

The manufacturing process known from the KOSAKI reference in fact does not teach how to solder the substrate on the support. This problem is resolved by means of a manufacturing process for a device as described above which comprises the following steps for soldering the chip on the support:

k) the interposition in sandwich fashion between the rear surface of the semiconductor substrate and the receiving surface of the support of a layer called preform layer of a material suitable for soldering, while the material of the anti-adhesion layer is such that it cannot be wetted by the soldering material, and the soldering material is such that it adheres strongly to the material of the ground plane, l) heating of the system formed by the substrate, the support, and the preform to a temperature higher than the fusion temperature of the soldering material, m) the application of a uniform pressure distributed over the entire front surface of the substrate for compressing the preform between the rear surface of the substrate and the receiving surface of the support, substantially without allowing soldering material to escape around the substrate, so as to cause the molten soldering material to rise in the via opening, n) cooling-down of the device thus formed.

Another problem which arises in the known manufacturing process is that a mask is used for realizing the anti-adhesion layer, that this mask must be very accurate, that it is necessarily different for each circuit, and that a very exact centering step of this mask must be carried out.

According to the invention, this problem is resolved by means of a process as described above and comprising the following steps for providing the chip with an anti-adhesion layer:

e) deposition of the anti-adhesion layer made of a material which adheres to the ground plane and which extends continuously over said ground plane on the rear surface and on the bottom and walls of the via opening, f) deposition on said anti-adhesion layer of a layer of photosensitive resin, called photoresist, in a planar manner, having an outer surface which is substantially plane so as to provide a first thickness which is comparatively small on the plane portion of said rear surface and a second, greater thickness inside the via opening, g) irradiation of the entire surface of said photoresist layer, without the use of any mask, over a thickness equal to or at least not substantially exceeding said first thickness, such that the portion of the photoresist layer deposited inside the via opening is irradiated over a small thickness only, at its surface, h) development of the irradiated portion of the photoresist layer, whereby a non-irradiated portion remains inside the via opening for serving as a mask for the anti-adhesion layer lying inside the via opening, but not for the portions of this layer situated outside the via, i) selective etching of the portions of the anti-adhesion layer lying outside the via opening, i.e. lying on the plane portion of the rear surface of the substrate, the subjacent portion of the ground plane layer being preserved owing to the selectivity of the etching, j) elimination of the photoresist portion remaining inside the via opening.

An advantage of this is that the process dispenses with a masking step and a mask centering step.

Another advantage is that the process is independent of the circuit under manufacture, because it is exactly the same for each and every circuit associated with a device of the type described above.

BRIEF DESCRIPTION OF THE DRAWING

FIGS. 2 and 3 illustrate in cross-section the method of manufacturing the device of FIG. 1, with:

FIG. 2E showing a deposition step for a planar photoresist layer.

FIGS. 4 illustrate in cross-section the method of fixing the chip of FIG. 2I or FIG. 3 by soldering on a support, with:

DETAILED DESCRIPTION OF THE INVENTION

Figure 1:
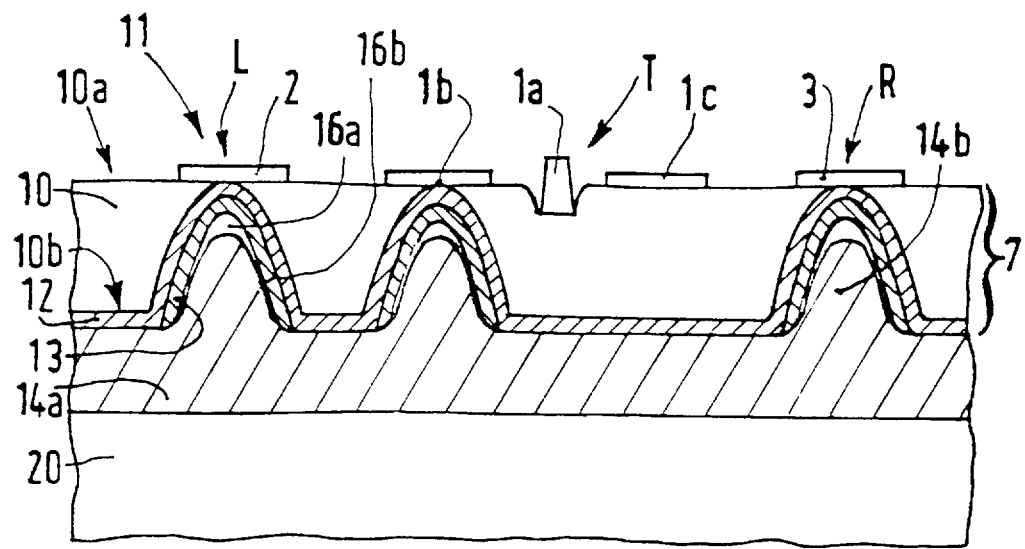
FIG. 1 is a cross-section of a semiconductor device with a chip which comprises a circuit one surface of a substrate and which is fixed with its other surface on a support by soldering.

A semiconductor device and a method of realizing this semiconductor device will be described below in detail with reference to the figures of the drawing, a preferred embodiment and modifications thereof, without being limited thereto.

In FIG. 1, a semiconductor device comprises a chip 7 which is fixed by soldering on a support 20. The chip 7 comprises a semiconductor substrate 10 which has a front surface 10a and a rear surface 10b, a conductor element 2 of an electronic circuit 11 on said front surface 10a, a via opening 16 which extends through the substrate and which has lateral walls 10c and a bottom 16c which coincides with the conductor element 2, a conductive layer called ground plane 12 covering said rear surface 10b as well as the lateral walls 10c and the bottom 16c of the via opening and forming a connection to the conductor element.

Said chip 7 in addition comprises a layer called antiadhesion layer 13 which is deposited on said ground plane exclusively inside the via opening, on the bottom 16c and the lateral walls 10c in a continuous manner up to a stopping level 40c or 40c' close to the rear surface 10b of the substrate.

Said chip 7 is fixed to said support 20 by means of a layer of a soldering material 14 of a type which adheres to the material of the ground plane 12 but which does not wet the anti-adhesion layer 13. In this system, said soldering layer has a planar portion 14a between the receiving surface 20a of the support 20 and the rear surface 10b of the substrate, and has a globular portion 14b which lies inside the via opening 16, while a free space 16a, 16b is maintained continuously all around said globular portion 14b between the soldering material and the anti-adhesion layer 13 from the bottom of the via opening up to said stopping level 40c, 40c' of the anti-adhesion layer.

The circuit 11 may be designed for any type of application and may comprise active or passive elements of any kind, interconnected by microribbon lines or other conductors. In FIG. 1, for example, the integrated circuit 11 comprises a field effect transistor T with a gate metallization 1a, an ohmic source contact 1b, a drain contact 1c; a resistor R of which one end 3 is shown; and a microwave frequency connection or line L represented by the metallization 2. The metallization layer 12 for the ground plane is in contact with, for example, the metallizations 2 of the line L, 1b of the source, and 3 of the resistor R through via openings 16 provided in the substrate and extending transversely from the rear surface 10b to the front surface 10a. The electrical connection between the conductor elements of the circuit 11 and the ground plane metallization 12 is ensured in that the ground plane metallization 12 is continuously provided also over the walls 10c of the via openings 16.

More in particular, the electronic circuit is a microwave frequency circuit of the monolithically integrated type (MMIC). The substrate 10 is of semiconductor or semi-insulating material from the chemical group III-V, for example gallium arsenide (GaAs), or any other material having comparable properties which permit of obtaining very high switching speeds.

Microwave frequency circuits made of gallium arsenide are very small and very vulnerable, in particular they have transistors with gate lengths which may be as small as 0.1 $\mu$m. The mechanical properties of gallium arsenide (GaAs) substrates are indeed much inferior to those of conventional silicon (Si) substrates. The material gallium arsenide is in particular very fragile.

Moreover, microwave frequency circuits require very thin substrates, in which the ground plane of the rear surface must lie at a predetermined distance from the lines realized on the front surface.

In addition, microwave-frequency circuits require the realization of electrically substantially perfect elements. To achieve this, the connections to the ground plane must be very short and must not have any discontinuities. This is why the realization of metallized via openings whose walls are covered with a metallization in electrical continuity with the ground plane and extending through the very thin substrate of gallium arsenide is particularly favorable.

Now the fixation by soldering of such a chip, comprising a fragile circuit realized on a thin, vulnerable substrate, to a support requires a high degree of perfection in the soldering process so that the problems enumerated above are avoided.

Figure 5A:
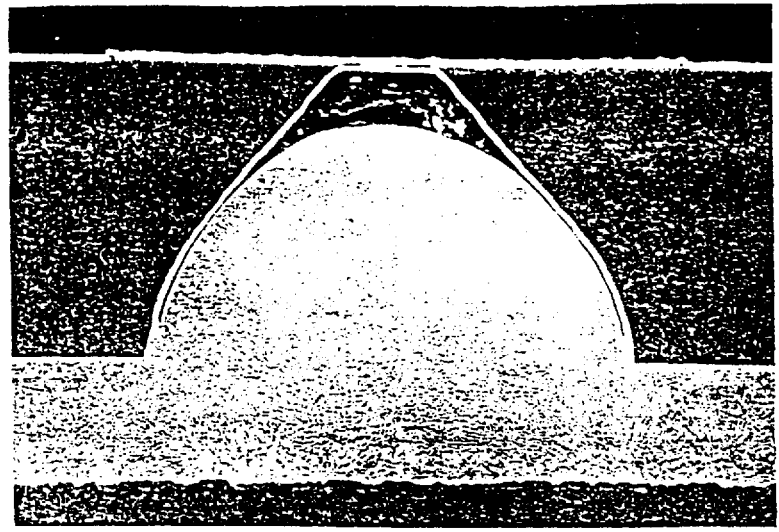
FIG. 5A is a photo of a via in cross-section.
Figure 5B:
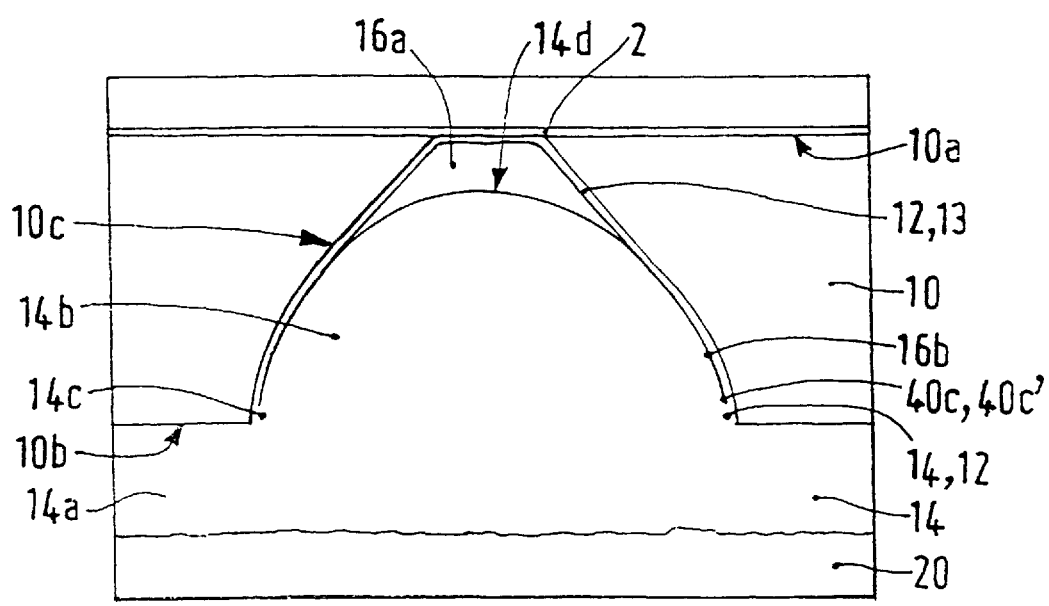
FIG. 5B is a simplified drawing on the basis of FIG. 5A.

The various parts of a device according to the invention fixed on its support 20 are shown in FIG. 5A, which is a photo of a via in cross-sectional view, realized through an electron scanning microscope with a magnification factor of approximately 400, and in FIG. 5B which is a simplified drawing on the basis of the photo of FIG. 5A. The drawing of FIG. 5B shows:

at reference numeral 2, a metal layer which forms a circuit element on the front surface 10a of a semiconductor substrate 10, which has a rear surface 10b;

at reference numeral 10c, the walls of a via which extend from the rear surface 10b to the front surface 10a through the substrate 10;

at reference numerals 12 and 13, an anti-adhesion layer 13 realized on the surface of a ground plane layer 12 and extending substantially over the entire walls of the via cavity; the layer 13 extends in particular over the bottom already covered by the metallization 2, on the walls 10c from the front surface 10a up to close to the rear surface 10b of the substrate; whereas the ground plane layer 12 completely covers the entire rear surface 10b, in the vias and outside the vias, the layer 13 stops substantially at the level referenced 40c, 40c' close to the lower surface 10b so that it covers substantially the entire wall of the via cavity without passing beyond this cavity;

at reference numeral 20, the support on which the device 7 comprising the substrate 10 is fixed through soldering of its rear surface 10b;

at reference numeral 14, the soldering material which fixes said substrate on said support.

The photo and the drawing of FIGS. 5A and 5B in addition show that:

the solder layer has a uniform thickness between the rear surface 10b and the support 20;

the solder material substantially fills the cavity of the via, leaving a free space 16a at the bottom of the via over a height of the order of 15% of the total via height, which is also the thickness of the substrate 10;

the solder material has a globular shape 14b inside the via, with an upper portion 14d having a dome shape, i.e. approximately spherical and following the concavity of the via; the solder material in the globular portion 14b follows exactly the shape of the walls 10c of the via, but without having any contact with the anti-adhesion layer 13 deposited on the ground plane 12.

The photo, reproduced in the drawing, shows very clearly a separation interval 16b which extends between the free space 16a and the level 40c, 40c' corresponding to the termination of the deposition of the anti-adhesion layer 13 adjacent the rear surface 10b.

The advantages of the device according to the invention which become apparent from the photo 5A and the drawing 5B are that:

the heat dissipation is very good because the free space 16a of approximately 15% is smaller than that in the prior art, which was approximately 50% (73.7 μm in relation to 150 μm), and because the interval 16b is practically negligible;

no cracks can arise in the semiconductor substrate because the soldering material 14b in globular form is never in mechanical contact with the walls of the via thanks to the interval 16b;

the height of the portion 14c beyond the level 40c, 40c' where the solder is occasionally in contact with the walls of the via is very small, of the order of 5% of the total via height, and is incapable of inducing cracks in the substrate.

The device shown in the photo 5A comprises:

a substrate 10 made of gallium arsenide with a thickness of 100 μm;

a solder layer 14 of 35 μm thickness. This layer could obviously be much thinner or much thicker;

a free space 16a having a height of the order of 15 μm; the height of this free space may vary, for example, from a few percents to 25% of the total via height;

a globular solder mass 14b of approximately 85 μm height; this height varies subject to the height of the free space 16a;

an interval 16b between the globular solder portion 14b and the anti-adhesion layer 13 of the order of 0.1 to 0.2 μm. The value of this interval may vary over a certain range as desired by those skilled in the art; in general, this interval is smaller than or of the order of 1 μm;

a distance between the level 40c, 40c' where the anti-adhesion layer 13 ends and the rear surface 10b of the substrate of the order of 0 to 10 μm, i.e. 0 to 10% of the height of the via.

The layer 12 for the ground plane is made of gold (Au), the anti-adhesion layer 13 is made of titanium (Ti), and the solder layer 14 is made of gold-tin (Au-Sn).

Modifications of this device are possible, in particular as regards the choice of materials and dimensions.

Figure 6A:
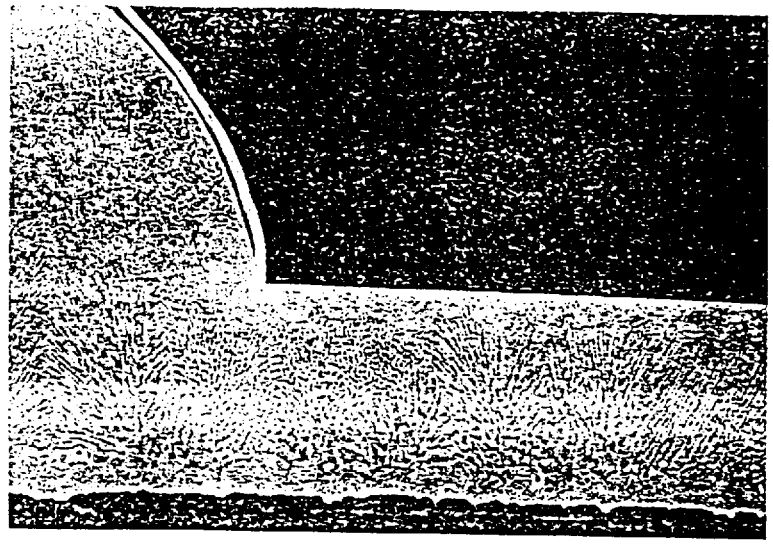
FIG. 6 a photo of an enlarged portion of FIG. 5A.
FIG. 6B is a simplified drawing on the basis FIG. 6A.
Figure 6B:
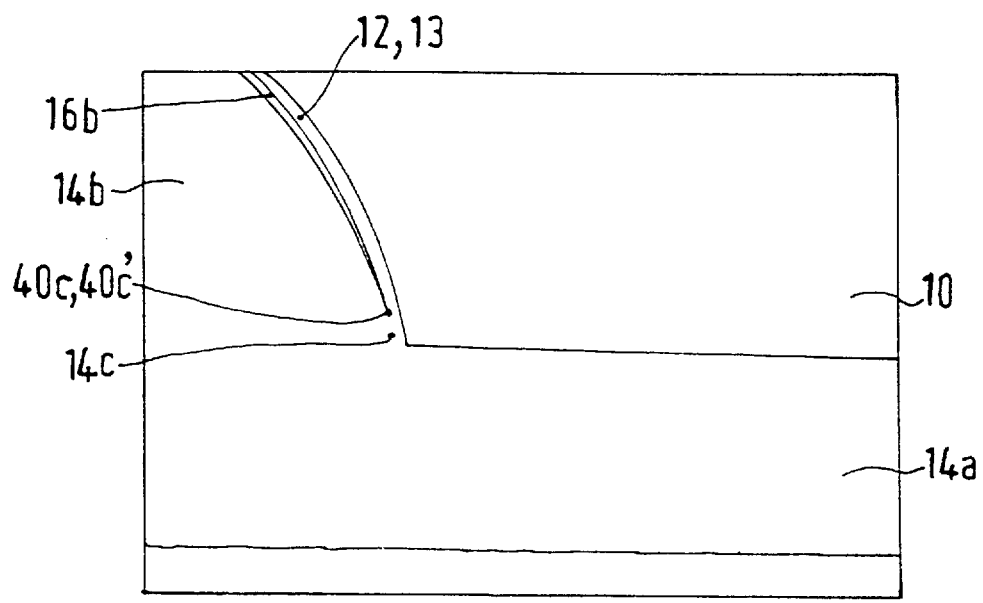

FIG. 6A is a photo of the same via as in FIG. 5A, showing a portion of this via with a greater magnification factor, approximately 625. The simplified drawing of FIG. 6B based on the photo of FIG. 6A shows that beyond the point 40c, 40c' where the anti-adhesion layer 13 ends the solder 14c, 14a adheres strongly to the ground plane 12 such that there is no difference visible anymore between the materials 12 and 14 in these zones.

It is accordingly the anti-adhesion layer 13 which permits of retaining the intervals 16a, 16b between the globular solder mass 14b and the walls of the via cavity.

Figure 7:
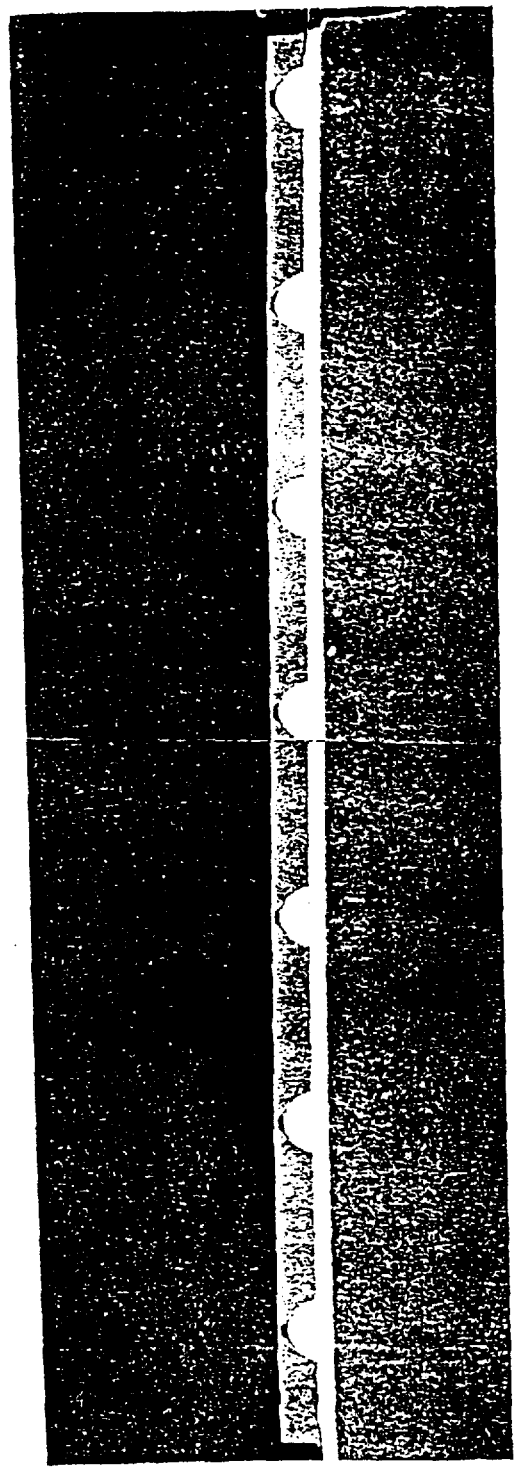
FIG. 7 is a photo of a finished device in cross-section.

FIG. 7 is a photo in two adjacent parts realized with an electronic scanning microscope with a magnification factor of approximately 50, showing in cross-section a substrate provided with seven vias, all realized in accordance with the invention, which substrate is soldered to a support. This photo demonstrates an advantage of the invention which is found in the homogeneity of the solder on a major surface. The solder rises in a homogeneous manner in the vias, and no disadvantageous blister arises.

Figure 2A:
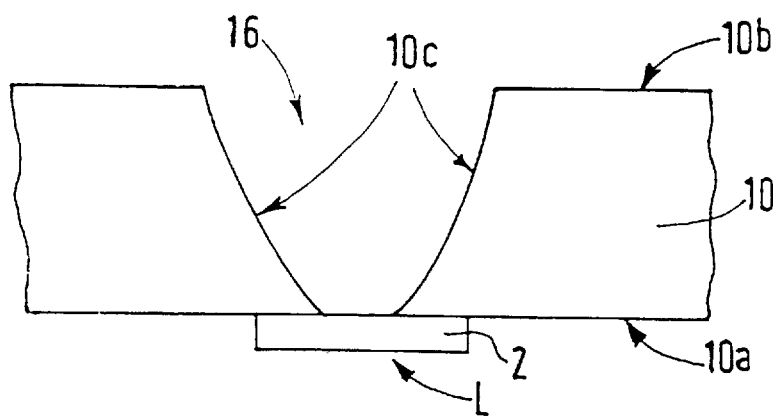
FIG. 2A showing the chip after etching of a via.
Figure 2B:
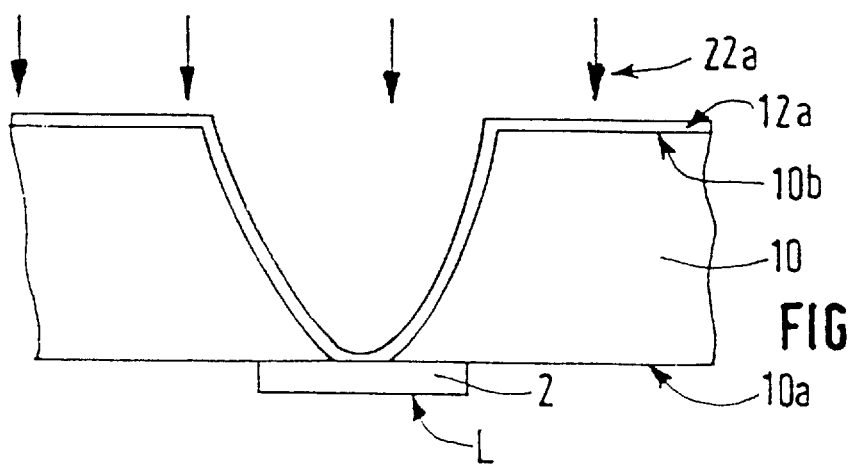
FIG. 2B showing a step in which a first metallization for a ground plane is provided.
Figure 2C:
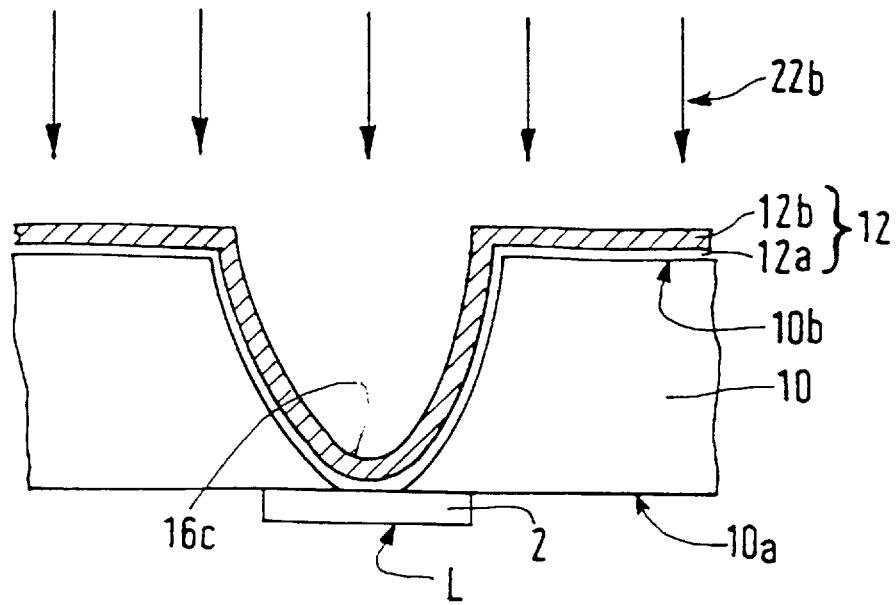
FIG. 2C showing a step in which a second metallization for a ground plane is provided.
Figure 2D:
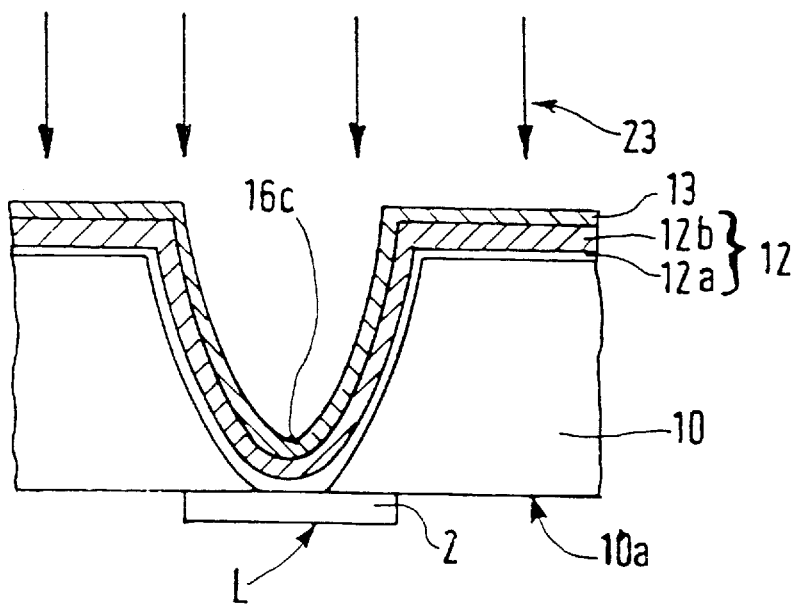
FIG. 2D showing a step in which an anti-adhesion layer is realized.
Figure 2F:
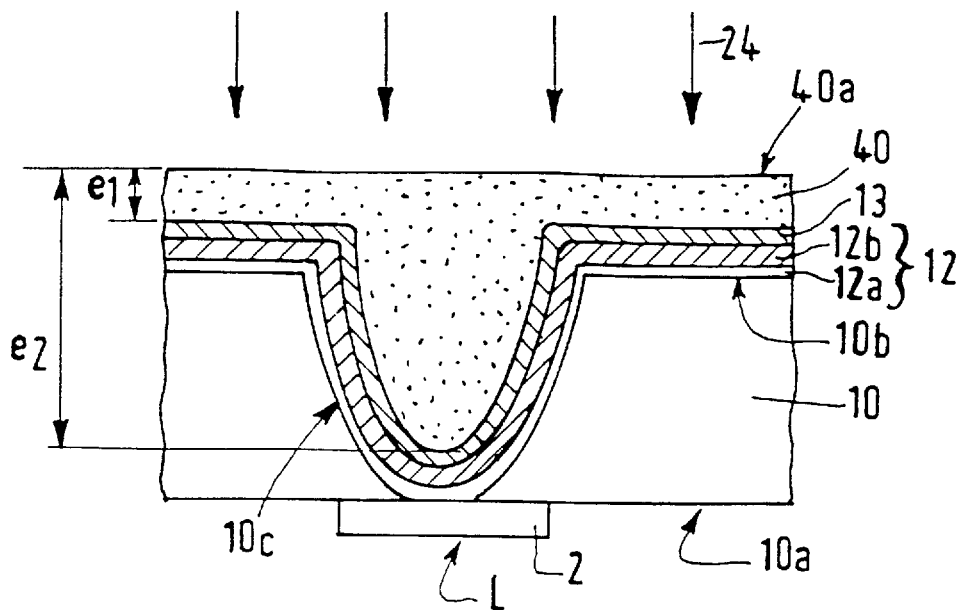
FIG. 2F showing an irradiation step for the photoresist layer without the use of a mask.
Figure 2F:
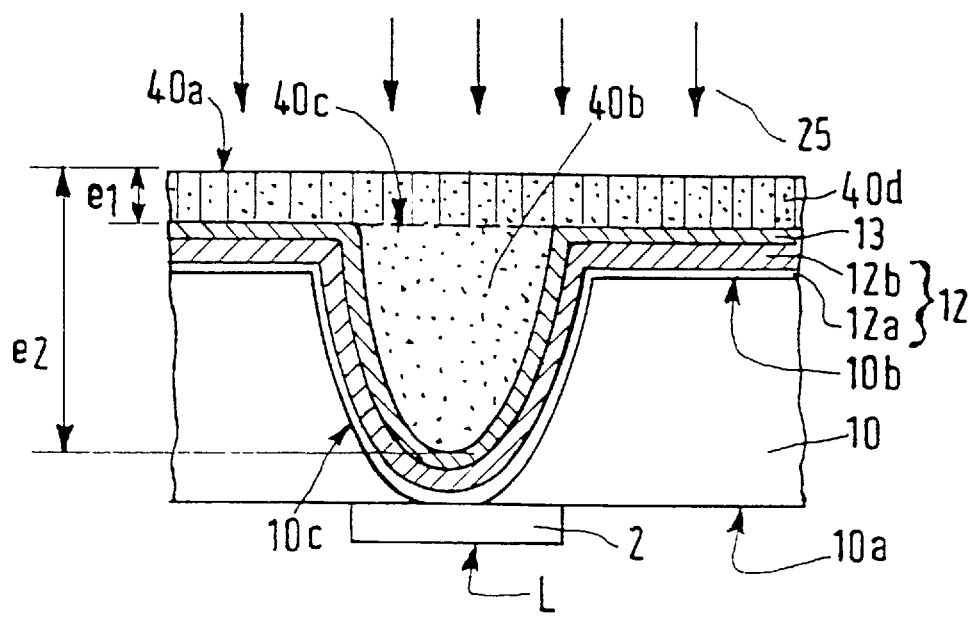
Figure 2G:
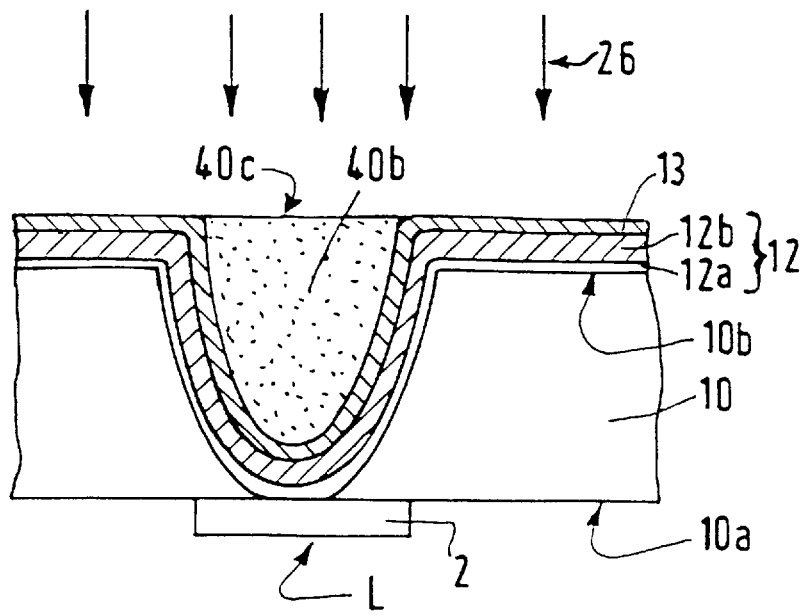
FIG. 2G showing a development step of the irradiated part of the photoresist layer.
Figure 2H:
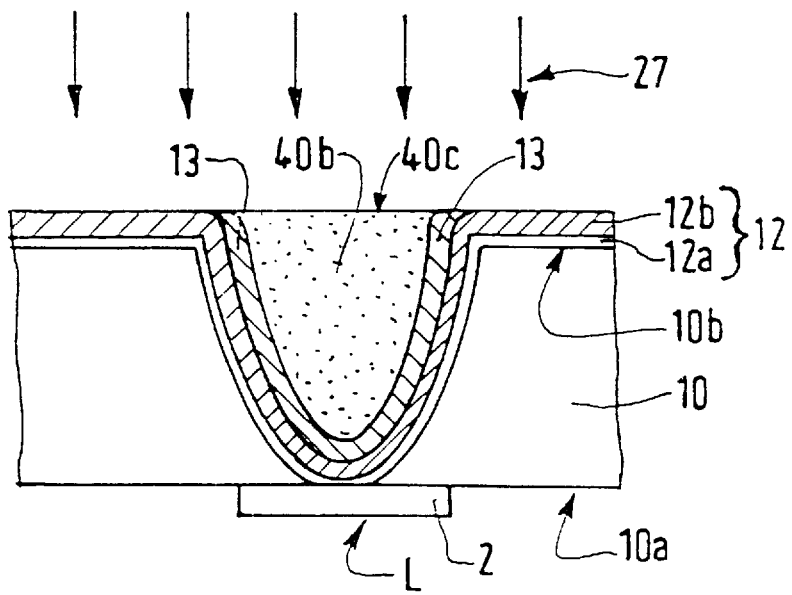
FIG. 2H showing an etching step of the anti-adhesion layer in the zones which are not protected by the remaining portions of the photoresist.
Figure 2I:
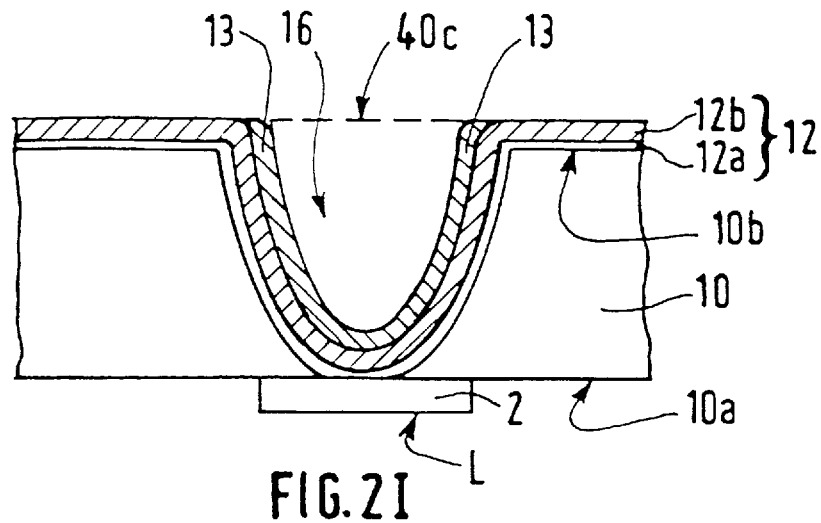
FIG. 2I showing the device after the removal of the photoresist; and with FIG. 3 showing a chip in a modified embodiment.
Figure 3:
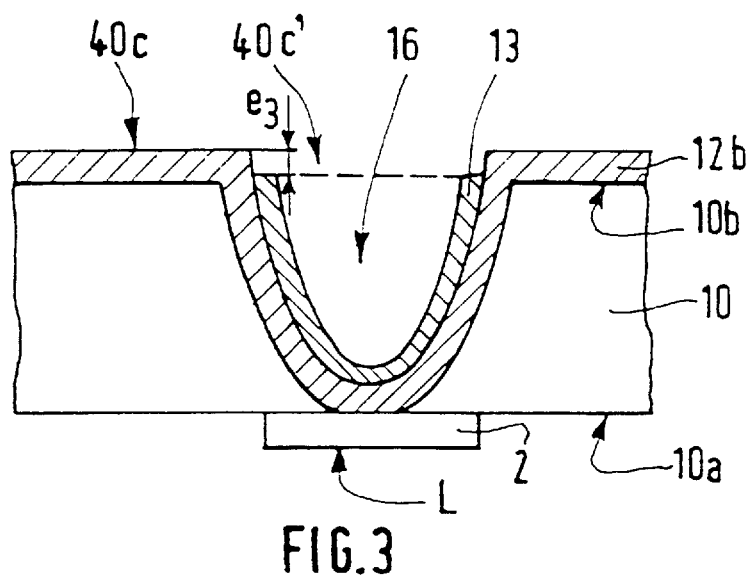

A method of realizing the chip and the support comprises steps a) to j), as illustrated in FIGS. 2A to 2I, and in FIG. 3.

As shown in FIG. 2A and FIG. 1, this method first of all comprises the steps:

a) provision of a semiconductor substrate 10 having a front surface 10a and a rear surface 10b, and provision of a support 20 having a receiving surface 20a, b) manufacture of a circuit 11 on the front surface 10a of the substrate with at least a conductor element 2, 1b, or 3, c) formation of at least one via opening 16 which extends transversely through the substrate 10 from the rear surface 10b to the front surface 10a, so as to coincide with the circuit element.

FIG. 2A shows the semiconductor device turned upside down. The electronic circuit 11 is, for example, a microwave frequency circuit of the MMIC type realized on the front surface 10a. The rear surface 10b faces upwards now and the substrate 10 is held in an appropriate position. In step c), the via opening is realized such that it is ensured that it coincides with one of the conductors 2, 1b, 3, for example, of the circuit 11. The via openings are realized, for example, by wet etching in a mixture of $H_2SO_4$, $H_2O_2$, and $H_2O$; or alternatively by dry etching through reactive ion etching (RIE). In the example described here, the substrate is of gallium arsenide (GaAs) and has a thickness of approximately 100 μm; the diameter of each via opening at the rear surface side 10b is approximately 100 μm, for example lying within a range from 50 to 150 μm.

The process subsequently comprises the following step:

d) deposition of a ground plane layer 12 which adheres to the semiconductor material and which extends over the rear surface 10b and continuously over the bottom 16c and the walls 10c of the via opening so that it is in electrical contact with the conductor element, for example, 2 of the circuit 11 of the front surface 10a.

In FIG. 2B, the formation of the ground plane metallization 12 comprises the formation of a first layer 12a or bonding layer. In the example described here, this bonding layer 12a is realized through cathode sputtering, symbolized by the arrows 22a, of titanium (Ti) in argon (Ar), which avoids the oxidization of the titanium (Ti). This layer preferably has a thickness of 0.1 μm, for example lying in a range from 0.001 to 0.15 μm. To obtain the envisaged effect, it is sufficient that this layer should have a thickness in excess of a few monoatomic titanium (Ti) layers. In FIG. 2C, the formation of the ground plane metallization 12 comprises the formation of a second layer 12b which forms the ground plane proper. In a modification of this process, shown in FIG. 3, the first layer 12a is absent and the ground plane metallization is solely formed by the second layer 12b, referenced simply 12 here. In the example described, the second layer 12b is made of gold (Au) provided by electrolytic deposition as symbolized by the arrows 22b. This second layer 12b preferably has a thickness of 2.5 μm, for example lying in a range from 2 to 3 μm. Generally, the metallization material for the ground plane 12 is chosen on account of its wetting properties promoting adhesion to the soldering material 14.

The process subsequently comprises; as shown in FIG. 2D, the following step for providing the chip 7 with the anti-adhesion layer 13:

e) deposition of the anti-adhesion layer 13 made of a material which adheres to the ground plane 12 and which extends continuously over said ground plane on the rear surface 10b and on the bottom 16c and the walls 10c of the via opening.

The material of the anti-adhesion layer 13 is chosen so as to avoid the subsequent adhesion of the soldering material 14. The anti-adhesion layer may be, for example, a dielectric, a synthetic-resin material, a resin, a glass, or a metal. Preferably a soldering material is chosen such that a manufacturing synergy with other semiconductor devices manufactured in series is obtained. To achieve this, the soldering material preferably is an alloy of gold and tin (Au-Sn) in a ratio of 80–20. Under these conditions, a material for the anti-adhesion layer which cannot be wetted by this alloy and which has given very good results is titanium (Ti). In FIG. 2D, the anti-adhesion layer is preferably made of titanium (Ti) through cathode sputtering as symbolized by the arrows 23, to a thickness of the order of 0.3 μm, for example lying in a range from 0.2 to 0.5 μm.

In FIGS. 2E and 2F, this process now assumes a particular importance for providing an industrial advantage and supplying a device with improved performance and comprises the following steps:

f) deposition, symbolized by the arrows 24, on said anti-adhesion layer 13 of a layer of photosensitive resin 40, referred to as photoresist, in a planar manner, with an outer surface 40a which is substantially plane such that it has a comparatively small first thickness e1 on the plane portion of said rear surface and a greater second thickness e2 inside the opening of the via 16.

Any product which achieves the same result as the photosensitive resin 40 may be used instead.

g) irradiation, symbolized by the arrows 25, with radiation having an appropriate wavelength in a classical manner of the entire surface of said photoresist layer 40, without the use of any mask, to a thickness equal to or not substantially greater than said first thickness e1 such that the portion of the photoresist layer deposited inside the opening of the via is irradiated through no more than such a small thickness e1 or e1+e3, at its surface.

The irradiation carried out uniformly within a limited thickness range 40d corresponding to the small thickness e1 of the photoresist on the planar zones of the rear surface 10b and at the surfaces of the via openings is obtained in a manner known to those skilled in the art through a control of the irradiation energy. It is important that the entire thickness e1 of photoresist present on the planar regions of the rear surface 10b should be irradiated, but not substantially more. A variation of a few μm may be admissible, for example approximately 5 μm of supplementary irradiation depth, such that an irradiation depth lying between e1 and e1+e3 is achieved, with e3=1 to 10 μm, which operation is easy to achieve for those skilled in the art. This irradiation does not require a mask, the particular arrangement of which would depend on the particular arrangement of the via openings in a particular circuit, i.e. a mask designed specifically for a given circuit. Neither is a difficult operation for centering the mask necessary. The irradiation is independent of the circuit.

The process subsequently comprises the following steps, as illustrated in FIGS. 2G and 2H:

h) development in a conventional manner, as symbolized by the arrows 26, of the irradiated portion 40d of the photoresist layer 40, whereby a non-irradiated portion 40b inside the via opening remains which is to serve as a mask for the anti-adhesion layer 13 situated inside the via opening, but exposing portions of this layer lying outside the via.

This non-irradiated portion 40b has an upper surface 40c or 40c' which lies at a level with or slightly lower than the outer surface of the anti-adhesion layer 13. The photoresist thickness in the via openings is equal to the initial thickness e2 minus the thickness e1 or e1+e3 which was eliminated after irradiation, as shown in the preceding FIG. 2F. The photoresist portion 40b forms a mask which was realized without the use of any tool specific to the given circuit and protects the anti-adhesion layer 13 in the via opening.

i) selective etching of the portions of the anti-adhesion layer 13 outside the via opening and situated on the planar portion of the rear surface of the substrate, while the portion of the subjacent ground plane layer 12 is preserved owing to the selectivity of the etching process.

In FIG. 2H, the portions of the anti-adhesion layer 13 which are not protected and which lie on the planar portions of the rear surface are etched in a selective etching process symbolized by the arrows 27, i.e. an etching process which attacks this layer 13 without attacking the subjacent layer 12. In the example given here, a selective wet etching process may be carried out in a chemical solution based on hydrofluoric acid (HF), or alternatively a dry reactive ion etching process may be carried out in a fluorine plasma.

The process subsequently comprises the following step, as shown in FIGS. 2I and 3:

j) elimination in a conventional manner of the photoresist portion 40b remaining inside the via opening 16.

After the photoresist has been eliminated, a portion of the anti-adhesion layer 13 remains in the via opening, strictly limited to the interior of the opening and not passing beyond the level 40c or 40c' corresponding to the irradiation depth. FIG. 3 shows the situation where this portion of the anti-adhesion layer 13 only reaches the level 40c', when the irradiation depth was of the order of, for example, e1+5 μm. The level 40c' lies slightly recessed inside the via opening.

Figure 4A:
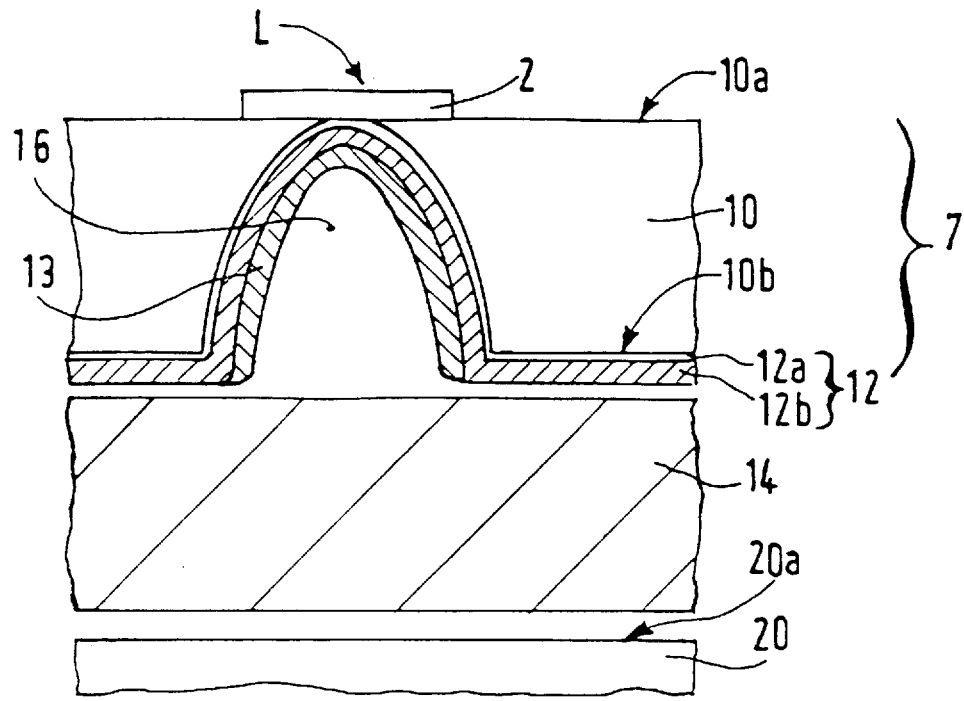
FIG. 4A showing how the components necessary for fixing the chip on a support are provided and positioned.
Figure 4B:
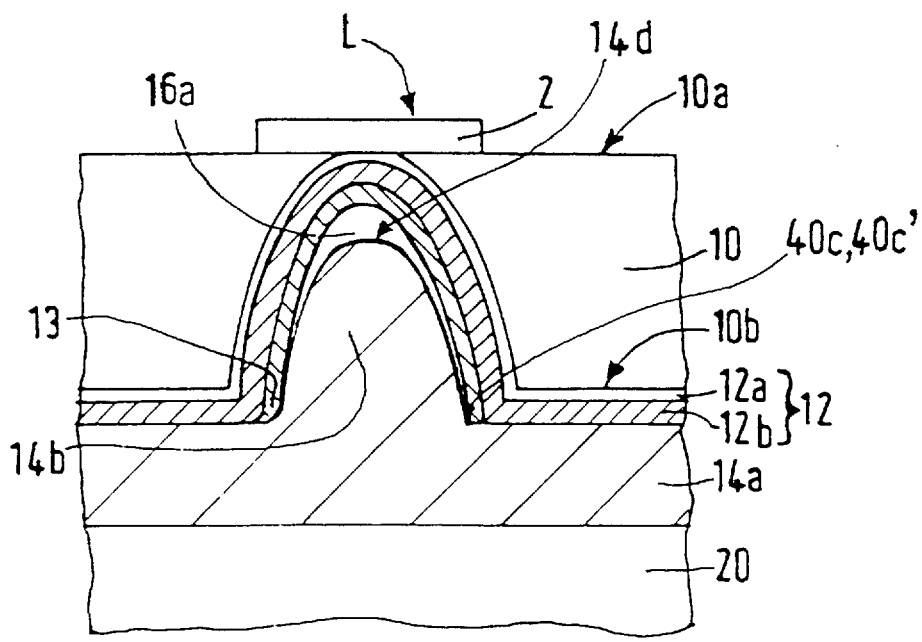
FIG. 4B showing the result of the soldering step.

The operation of fixing the chip 7 on the support 20 by soldering is finally illustrated in FIGS. 4A, 4B, and comprises the steps k) to n):

k) interposition in sandwich fashion between the rear surface 10b of the semiconductor substrate and the receiving surface 20a of the support 20 of a layer 14, called preform layer, of a material suitable for soldering, the material of the anti-adhesion layer 13 being such that it cannot be wetted by the soldering material 14, while the soldering material 14 is such that it adheres strongly to the material of the ground plane 12.

In FIG. 4A, the chip 7 is placed with its front surface 10a facing upwards and its rear surface opposite the receiving surface 20a on the support 20, which may be of any suitable material such as aluminum or alumina oxide, for example provided with a metallization layer.

l) heating of the system formed by the substrate 10, the support 20, and the preform 14 to a temperature higher than the fusion temperature of the soldering material.

In the example given here, where the preform is a gold-tin (Au-Sn) alloy, the assembly is brought to a temperature slightly higher than the fusion temperature of the eutectic material, of the order of 280° C., so as to cause the preform to melt.

m) application of a uniform pressure distributed over the total front surface of the substrate for compressing the preform 14 between the rear surface 10b of the substrate and the receiving surface 20a of the support substantially without allowing the soldering material to escape around the substrate, so that the molten soldering material is made to rise in the via opening.

The uniform pressure of a few g per mm$^2$ is applied, for example, by means of a suitable tool. Means are applied also for preventing the solder from escaping around the substrate so that the compression effect is not canceled out. Those skilled in the art can select the value of the pressure, for example from 1 to 50 g per mm$^2$, on the basis of their experience in a suitable manner so that the soldering material rises to a suitable height in the via opening. The pressure depends inter alia on the viscosity of the solder, and on the number and dimensions of the via openings.

n) cooling-down of the device.

I claim:

1. A semiconductor device comprising a chip (7), with a semiconductor substrate (10) having a front surface (10a) and a rear surface (10b), a conductor element (2) of a circuit on said front surface (10a), a via opening (16) extending through the substrate and having lateral walls (10c) and a bottom (16c) which coincides with the conductor element (2), a conductive layer or ground plane (12) covering said rear surface and the lateral walls (10c) and the bottom (16c) of the via opening and forming a connection to the conductor element, and a support (20) with a receiving surface (20a) on which the chip is soldered with its rear surface, wherein said chip (7) in addition comprises a layer called anti-adhesion layer (13) which is deposited on said ground plane exclusively inside the via opening, provided continuously over the bottom (16c) and the lateral walls (10c) up to a stopping level (40c, 40c') which lies close to the rear surface (10b) of the substrate, and said chip (7) is fixed to said support (20) by means of a layer of a soldering material (14) of a type which adheres to the ground plane material (12) and does not wet the anti-adhesion layer (13), such that:

said layer of soldering material (14) has a planar portion (14a) between the receiving surface (20a) of the support (20) and the rear surface (10b) of the substrate, and has a globular portion (14b) which is present inside the via opening (16), and a free space (16a, 16b) is maintained continuously around said globular portion (14b) between the soldering material and the anti-adhesion layer (13) from the bottom of the via opening up to said stopping level (40c, 40c') of the anti-adhesion layer.

2. A device as claimed in claim 1, wherein the distance between the stopping level (40c, 40c') of the anti-adhesion layer and the rear surface (10b) of the substrate lies between 0% and approximately 10% of the height of the via opening; wherein the globular solder portion (14a) has a top in the shape of a dome (14d) towards the bottom (16c) of the via opening, and the free space (16a) between the top of the dome (14d) and said bottom (16c) is greater than 0% and smaller than or equal to 25% of the height of the via opening; and wherein the free space (16b) between the globular solder portion (14a) and the lateral walls (10c) of the via opening is greater than 10% and smaller than or approximately equal to 1% of said height.

3. A device as claimed in claim 2, wherein the substrate has a thickness of 100 μm, the stopping level (40c, 40c') of the anti-adhesion layer (13) lies between 0 and 10 μm from the rear surface (10b) of the substrate, the free space (16a) between the top of the dome (14d) and the anti-adhesion layer at the bottom (16c) of the via opening is greater than 0 μm up to approximately 25 μm, and the free space (16b) between the globular solder portion (14a) and the lateral walls (10c) is greater than 0 μm up to the order of 1 μm.

4. A device as claimed in claim 3, wherein the stopping level (40c') of the anti-adhesion layer is approximately 5 μm from the rear surface (10b) of the substrate, the free space (16a) between the top of the dome (14d) and the anti-adhesion layer (13) is approximately 15 μm, and the free space (16b) between the globular solder portion (14a) and the lateral walls (10c) is approximately 0.1 μm to 0.5 μm.

5. A semiconductor device as claimed in claim 1 wherein the anti-adhesion layer (13) is made of a conductor material.

6. A semiconductor device as claimed in claim 5, wherein the conductor material of the anti-adhesion layer (13) is titanium (Ti), and the soldering material (14) is a gold-tin (Au-Sn) alloy.

7. A semiconductor device as claimed in claim 6, wherein the ground plane layer (12) includes a thin layer (12a) of titanium-gold (Ti-Au) for bonding to the semiconductor material and deposited prior to a conductive layer (12b) of gold (Au).

8. A device as claimed in claim 1, wherein the semiconductor substrate (10) is manufactured from a material of the chemical group III-V.

9. A device as claimed in claim 8, wherein the circuit arranged on the front surface (10a) of the chip (7) is a monolithically integrated microwave frequency circuit (MMIC), and the substrate (10) is made of gallium arsenide (GaAs).

* * * * *